United States Patent
Schmidt

(10) Patent No.: US 12,025,687 B2
(45) Date of Patent: Jul. 2, 2024

(54) SYSTEM FOR CALIBRATION MANAGEMENT AND METHOD OF MANAGING CALIBRATION

(71) Applicant: Rohde & Schwarz GmbH & Co. KG, Munich (DE)

(72) Inventor: Kai-Uwe Schmidt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/396,472

(22) Filed: Aug. 6, 2021

(65) Prior Publication Data

US 2023/0039158 A1  Feb. 9, 2023

(51) Int. Cl.
*G01R 35/00* (2006.01)
(52) U.S. Cl.
CPC .................. *G01R 35/005* (2013.01)
(58) Field of Classification Search
CPC ....................................... G01R 35/005
See application file for complete search history.

(56) References Cited

U.S. PATENT DOCUMENTS

| | | | | |
|---|---|---|---|---|
| 6,066,953 A | * | 5/2000 | Wadell | G01R 31/3167 324/762.01 |
| 8,515,517 B2 | * | 8/2013 | Hayter | A61B 5/725 600/347 |
| 9,843,337 B1 | * | 12/2017 | Li | H03M 1/1009 |
| 10,514,436 B2 | * | 12/2019 | Leibfritz | G01R 35/005 |
| 2019/0078878 A1 | * | 3/2019 | Ding | G01B 21/042 |
| 2019/0372221 A1 | * | 12/2019 | Wu | H01Q 3/267 |

FOREIGN PATENT DOCUMENTS

| | | | | |
|---|---|---|---|---|
| CN | 107765133 A | * | 3/2018 | |
| CN | 106405250 B | * | 11/2020 | G01R 27/20 |
| EP | 2551650 A1 | * | 1/2013 | G01D 18/008 |
| EP | 2551650 | * | 3/2013 | G01D 18/008 |
| JP | 5066165 B2 | * | 11/2012 | Y02P 90/30 |

* cited by examiner

*Primary Examiner* — Alexander Satanovsky
(74) *Attorney, Agent, or Firm* — CHRISTENSEN O'CONNOR JOHNSON KINDNESS PLLC

(57) ABSTRACT

A system for calibration management is described. The system includes at least one measurement instrument for testing a device under test and a monitoring device. The monitoring device is connected with the measurement instrument. The monitoring device collects parameters from the measurement instrument during the testing. The monitoring device creates a calibration fingerprint based on the parameters collected, which is indicative of the calibration status of the measurement instrument. The system includes an interface via which information based on the calibration fingerprint is outputted, indicating if a new calibration of the measurement instrument is necessary or not. Further, a method of managing calibration of a measurement instrument is described.

19 Claims, 2 Drawing Sheets

- State of the art -

SYSTEM FOR CALIBRATION MANAGEMENT AND METHOD OF MANAGING CALIBRATION

FIELD OF THE DISCLOSURE

Embodiments of the present disclosure relate generally to a system for calibration management. Further, embodiments of the present disclosure also relate to a method of managing calibration of a measurement instrument.

BACKGROUND

Electronic devices are typically tested by measurement instruments that have to be calibrated in order to ensure proper testing of the devices under test.

It is known in the state of the art to check the respective measurement instrument in regular intervals, as the measurement instrument has to undergo a so-called service check that is done at a factory by educated technicians. The service check is associated with a service interval.

Besides the service check, it is also necessary to calibrate the measurement instrument used for testing the device under test in field, namely at the premises of the user of the measurement instrument. Hence, the respective measurement instrument is calibrated at its testing location, thereby taking the respective environmental conditions at this location into account. Typically, these calibrations, which distinguish from the service checks done during the service intervals, are also predefined and fixed, for instance every third day at a certain time or rather at defined times periods such as every week.

However, the predefined and fixed intervals do not take the effective usage of the measurement instrument into account, which has an influence on the calibration status. This results in a probably bad ratio of usage time versus downtime of the measurement instrument, wherein the later one is caused by the fixed calibration times done at the premises of the user of the measurement instrument.

Accordingly, there is need for a system for calibration management that ensures to improve the ratio of the measurement instrument usage versus down time due to calibration.

SUMMARY

The subject matter of the independent claims satisfies the respective need or others. Further embodiments are indicated within the dependent claims and the following description, each of which, individually or in combination, may represent aspects of the disclosure. Some aspects of the present disclosure are explained with regard to devices others with regard to methods. However, these aspects can be correspondingly transferred vice versa.

A summary of certain embodiments disclosed herein is set forth below. It should be understood that these aspects are presented merely to provide a brief summary of these embodiments and that these aspects are not intended to limit the scope of this disclosure. This disclosure may encompass a variety of aspects that may not be set forth below.

Embodiment of the present disclosure provide a system for calibration management. In an embodiment, the system comprises at least one measurement instrument for testing a device under test and a monitoring device. The monitoring device is connected with a measurement instrument. The monitoring device collects parameters from the measurement instrument during the testing, namely the testing of the device under test connected with the measurement instrument. The monitoring device creates a calibration fingerprint based on the parameters collected, which is indicative of the calibration status of the measurement instrument. The system also comprises an interface via which information based on the calibration fingerprint is outputted, indicating if a new calibration of the measurement instrument is necessary or not.

Embodiments of the present disclosure also provide a method of managing calibration of a measurement instrument. In an embodiment, the method comprises the steps of:
  performing a test on a device under test by a measurement instrument;
  collecting parameters from the measurement instrument by a monitoring device;
  processing the parameters collected by the monitoring device;
  creating a calibration fingerprint based on the parameters collected, which is indicative of the calibration status of the measurement instrument; and
  outputting information based on the calibration fingerprint via an interface, wherein the information indicates if a new calibration of the measurement instrument is necessary or not.

Accordingly, a dynamic and continuous calibration monitoring is provided by the monitoring device that creates the calibration fingerprint of the measurement instrument used for testing the device under test. The calibration fingerprint is obtained by taking parameters into account that have been collected by the monitoring device during the respective tests performed on the device under test by the measurement instrument. The respective parameters are collected and evaluated in order to obtain the calibration fingerprint that provides information concerning the actual calibration status of the measurement instrument, thereby ensuring that effects having an influence on the calibration status are taken into consideration.

Generally, the calibration associated with the calibration fingerprint is different to a service check that has to be done on a regular basis during service intervals in a factory due to degradations or rather variations of internal components of the measurement instrument.

In some embodiments, the calibration to be performed, which is associated with the calibration fingerprint, shall remove effects associated with the entire measurement setup that comprises the measurement instrument, e.g., erroneous connections between the measurement instrument and the device under test due to loosened cable connections and the like. Accordingly, the calibration mentioned throughout this disclosure concerns the calibration of the measurement instrument with regard to the measurement setup into which the measurement instrument is incorporated.

The dynamic and continuous calibration monitoring ensures that the ratio of measurement instrument usage with respect to the down time of the measurement instrument can be improved, as the calibration interval is dynamically adapted provided that the current calibration status still fulfills the respective requirements for proper operability of the measurement instrument within the measurement setup.

Hence, there is an increase of throughput in typical component production scenarios, which were limited amongst others by downtimes due to necessary calibrations of the measurement instrument with regard to the measurement setup.

Generally, the calibration of the measurement instrument shall ensure an improvement of the performance of the measurement instrument or rather an improved accuracy of the measurement instrument when interacting with the device under test.

The interface may be a user interface that outputs the information directly to a user, e.g., in a visual and/or acoustic manner like a graphical user interface (GUI). However, the interface may also relate to a system interface such that another system is connected with the interface, which receives the information for further processing, e.g., further evaluation or rather analysis.

An aspect provides that the system is a calibration management system that is configured to manage the calibration of the measurement instrument, for example with regard to the measurement setup that comprises the measurement instrument. The calibration management system is used to manage and schedule necessary calibrations of the measurement instrument, wherein the respective calibrations are dynamically adapted due to the continuous monitoring of the parameters that are used to create the calibration fingerprint.

Another aspect provides that at least one environmental parameter is also taken into account when creating the calibration fingerprint, wherein the at least one environmental parameter includes at least one of an environmental temperature and an environmental humidity. Generally, the environmental parameters like temperature and humidity may have an influence on the measurement instrument such that they are taken into account.

The parameters collected may include at least one of an uncertainty from measurement, a check of a golden standard, a parameter defined in IEEE 370, a parameter associated with a movement of a component connected to the measurement instrument, a parameter associated with a movement of the measurement instrument, a power on and power off cycle, an idle time, a usage time, an expected life time, a number of failed self-alignments, or a temperature profile of the measurement instrument, etc. For instance, a cable connected to the measurement instrument, which is part of the measurement setup used for testing the device under test, may have moved, thereby having an effect on the measurement instrument, which can be detected accordingly.

Generally, the parameters used for creating the calibration fingerprint may concern a calibration confidence check, an integrity check or rather other parameters obtained by various different methods in order to characterize the measurement instrument with regard to its calibration status, for example concerning the overall measurement setup.

The respective parameters may be obtained during the testing of the device under test when performing a certain test routine, wherein the parameters are measured simultaneously.

For instance, a certain voltage or rather a certain currant is provided to the device under test during the test routine, wherein the voltage or rather current is measured in order to verify if the measurement instrument is enabled to provide the respective current or voltage constantly. Thus, the value of the voltage or rather current may relate to a parameter captured.

The IEEE 370 parameters are defined or standardized parameters used for electrical characterization of electric devices, for example scattering parameters or s-parameters integrity.

In addition, the parameters may be obtained by a calibration confidence check, e.g., a vector network analyzer (VNA) calibration confidence check.

Moreover, trends and/or statistics of the parameters may be taken into account when creating the calibration fingerprint. The monitoring device may comprise a memory that is used for storing historical parameters that are taken into account in order to identify a trend of a parameter during the actual calibration interval or rather to obtain a certain statistic of at least one parameter. Hence, it can be verified whether the certain parameter starts changing in a certain way, for instance decreasing or rather increasing, which may be an indicator of a necessary calibration in the near future.

In some embodiments, the trend and/or statistic may be gathered by collecting the same parameter during subsequent measurements or rather tests performed, wherein these measurements or rather tests are similar.

The calibration fingerprint may be created based on various different methods used for obtaining the parameters. As mentioned above, the calibration fingerprint may be based on different kinds of parameters obtained during the measurement performed on the device under test. Therefore, the different methods may be associated with different measurements performed on the device under test.

Generally, the monitoring device checks the calibration fingerprint created against a margin associated with the calibration fingerprint. Thus, it is verified whether the measurement instrument is still within the margin provided, which ensures proper operation of the measurement instrument and, therefore, reliable test results.

The monitoring device may be configured to determine an urgency of the calibration when checking the calibration fingerprint created against the margin. The deviation of the calibration fingerprint created with respect to the margin can be determined in order to check whether the calibration is urgent or not, which depends on the respective deviation. For instance, a large deviation is associated with an urgent calibration.

The monitoring device may be configured to identify when checking the calibration fingerprint created against the margin if the calibration is not necessary, if the calibration is necessary soon or if the calibration has to be done immediately. Therefore, the monitoring device is enabled to provide the respective information concerning the urgency of the calibration via the interface in order to inform a user of the measurement instrument appropriately. The respective information may be displayed by a text or rather a symbol/icon that can be understood easily.

Furthermore, the monitoring device may create the calibration fingerprint for each measurement performed by the measurement instrument. Therefore, the calibration fingerprint is continuously created and dynamically adapted such that the calibration fingerprint is always up to date. Thus, a dynamic and continuous evaluation may take place. Due to the continuous creation or rather the ongoing adaption of the calibration fingerprint, it is ensured that the calibration fingerprint is continuously adjusted to the real conditions.

Moreover, the monitoring device may check the calibration fingerprint created against the margin for each measurement performed by the measurement instrument. The respective check whether the measurement instrument is within the defined operational range is done for each individual measurement performed on the device under test by the measurement instrument in order to ensure continuous calibration monitoring based on the calibration fingerprint.

In other words, the system may provide a continuous calibration monitoring, as the calibration fingerprint is created continuously for each individual measurement performed by the measurement instrument, wherein the respective calibration fingerprint is checked against the respective margin.

Furthermore, the monitoring device may adapt the margin associated with the calibration fingerprint. Thus, a dynamic adaption of the margin is possible that is compared with the continuously and dynamically created calibration fingerprint.

The monitoring device may adapt the margin associated with the calibration fingerprint after each check. Accordingly, a new margin is derived for the next run, namely the next measurement performed by the measurement instrument.

In addition, the information provided via the interface may comprise information about how to protract the new calibration. Accordingly, hints and/or information is provided how to stretch the next calibration such that more devices under test can be measured by the measurement instrument within the current calibration interval, thereby improving the ratio of usage time with respect to downtime.

For instance, the monitoring device may recognize that a temperature change is critical or rather mainly effects the measurement instrument such that the monitoring device suggests to maintain the temperature in a certain temperature range in order to avoid a negative influence on the measurement instrument.

Alternatively, the monitoring device may recognize that a cable is out from a trend, wherein a port of the measurement instrument is associated with this issue. Hence, the monitoring device may output an information concerning the respective port of the measurement instrument, thereby suggesting to exchange the cable at the respective port having the issue.

Further, the interface may provide test-specific information. The test-specific information may be associated with a certain test routine that is associated with a different specification.

The test-specific information may also be based on the device under test to be tested by the measurement instrument. Thus, a specific type of device under test is taken into account, which is tested differently.

The user may use the test-specific information in order to create a specific performance sheet for the device under test undergoing the respective test routine. The specific performance sheet may include a confidence level for the performance metrics and actual score.

The monitoring device may provide the interface. Hence, the interface that is enabled to provide the information based on the calibration fingerprint may be part of the monitoring device, e.g., a display or rather a data interface.

As indicated above, the calibration fingerprint obtained when evaluating the parameters collected relates to a systematic derivation of a figure of merit (FOM), describing the characteristics of the calibration of the measurement instrument, for example with respect to the measurement setup that comprises the measurement instrument.

The calibration fingerprint is used as an input for the continuous process that allows to dynamically adjust the calibration interval for the measurement instrument, for example the entire measurement setup comprising the measurement instrument as main component, resulting in the improved ratio of measurement instrument usage versus downtime of the measurement instrument due to calibration.

Generally, the measurement setup comprises the measurement instrument and at least one cable connected with a port of the measurement instrument and/or a fixture for connecting the device under test, for example with the measurement instrument. Moreover, the measurement setup may comprise further test equipment that is electrically connected with the measurement instrument, thereby having an influence on the (overall) calibration status of the measurement instrument in case that any deviations take place, e.g., a movement of an external component connected with the measurement instrument.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

Figure 1:
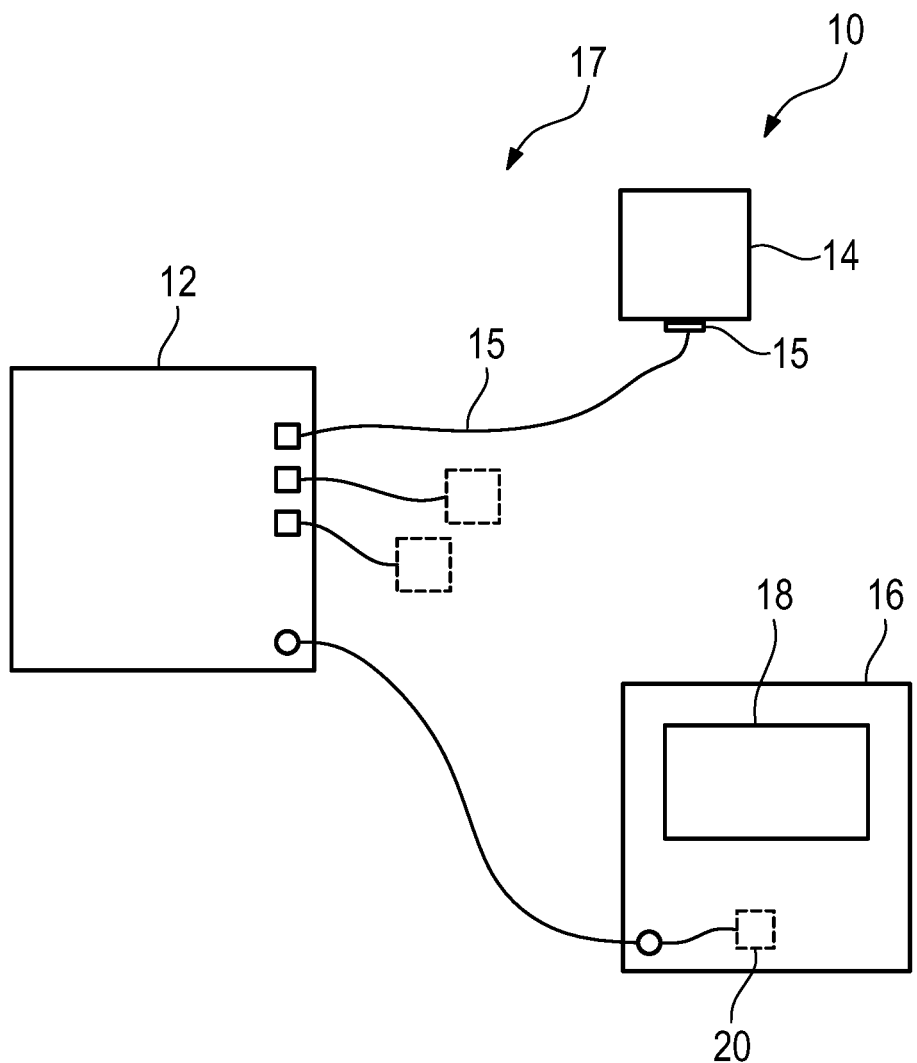
FIG. 1 schematically shows a system for calibration management according to an embodiment of the present disclosure.

In FIG. 1, a system 10 for calibration management is shown, which comprises at least one measurement instrument 12 for testing a device under test (DUT) 14, e.g., an electronic device. The device under test 14 is connected with the measurement instrument 12, for example in a wired or rather wireless manner Hence, the device under test 14 may be connected to the measurement instrument 12 by components 15 like cable(s) and/or fixture(s). Accordingly, the measurement instrument 12 is enabled to test the device under test 14 according to a certain test routine in order to characterize the device under test 14 with regard to properties/characteristics.

The system 10 may further comprise a monitoring device 16 having one or more circuits. The monitoring device 16 is connected with the measurement instrument 12 such that the monitoring device 16 is enabled to collect parameters from the measurement instrument 12 during testing the device under test 14.

These parameters collected may include an uncertainty from a measurement of the device under test 14, a check of a golden standard used instead of the device under test 14, and/or a parameter defined in IEEE 370, namely a parameter used for electrical characterization of electric devices, for example scattering parameters or rather s-parameters integrity.

Moreover, the parameters collected may include a parameter associated with a movement of at least one component 15 connected to the measurement instrument 12 like cable(s) and/or fixture(s), a parameter associated with a movement of the measurement instrument 12 itself, a power on and power off cycle of the measurement instrument 12, an idle time of the measurement instrument 12, a usage time of the measurement instrument 12, an expected lifetime of the measurement instrument 12, a number of failed self-alignments of the measurement instrument 12, and/or a temperature profile of the measurement instrument 12.

All these parameters may be collected by the monitoring device 16 in order to monitor the measurement instrument 12 during testing the device under test 14.

The monitoring device 16 receives the different kinds of parameters from the measurement instrument 12 during the testing of the device under test 14, wherein the monitoring device 16 creates a calibration fingerprint based on the parameters collected. In other words, the calibration fingerprint is created based on various different methods used for obtaining the parameters.

The calibration fingerprint is indicative the calibration status of the measurement instrument 12 such that it is investigated whether a measurement instrument 12 is in a calibrated state or not. Furthermore, it can be derived from the calibration fingerprint when the next calibration of the measurement instrument 12 is necessary.

Moreover, the calibration fingerprint may be created based on trends and/or statistics of the parameters collected, thereby identifying a changing behavior of a certain parameter, for instance an increasing uncertainty.

In general, the device under test 14 is part of a measurement setup 17 that comprises the measurement instrument 12, the components 15 like the cable(s) and/or fixture(s) used for connecting the device under test 14 with the measurement instrument 12 and, optionally, further instruments that might be connected with the measurement instrument 12 (which are indicated by dashed lines in FIG. 1). All these different components/instruments/devices used for setting up the measurement setup may have an influence on the calibration status of the measurement instrument 12 for example the entire measurement setup, at the premises of the user. In other words, all these different components/instruments/devices may affect the calibration status of the measurement instrument 12.

The system 10 further comprises an interface 18 via which information can be outputted, namely information based on the calibration fingerprint created based on the parameters collected during the testing of the device under test 14.

The interface 18 may be a graphical user interface (GUI) that provides the respective information directly to a user of the system 10, namely in a visual manner. However, the interface 18 may also relate to a data interface that forwards the respective information to a subsequent system that processes the information obtained. In some embodiments, the interface 18 relates to a Simple Network Management Protocol (SNMP) interface. In the shown embodiment, the interface 18 is a graphical user interface that is part of the monitoring device 16.

The information is outputted in order to inform the user of the system 10 if a new calibration of the measurement instrument 12 is necessary or not. Further, information may be outputted via the interface 18 how the new calibration can be protracted such that more devices under test 14 can be tested by the measurement instrument 12 in the actual calibration interval, thereby postponing the next calibration.

Accordingly, the system 10 is a calibration management system configured to manage and schedule the calibration of the measurement instrument 12, as information is provided if the calibration is due (soon) and, optionally, how to postpone the next calibration while maintaining the measurement instrument 12 in its operational state.

The monitoring device 16 comprises a processing circuit 20 that receives the parameters from the measurement instrument 12 and processes them accordingly in order to create the calibration fingerprint that is indicative of the calibration status of the measurement instrument 12, for example the entire measurement setup 17 or rather the calibration status of the measurement instrument 12 with respect to the measurement setup 17.

Besides the parameters received from the measurement instrument 12, the monitoring device 16, for example the processing circuit 20, may (additionally) take environmental parameters into account like the environmental temperature and/or the environmental humidity, which may also have an impact on the calibration status of the measurement instrument 12.

Figure 2:
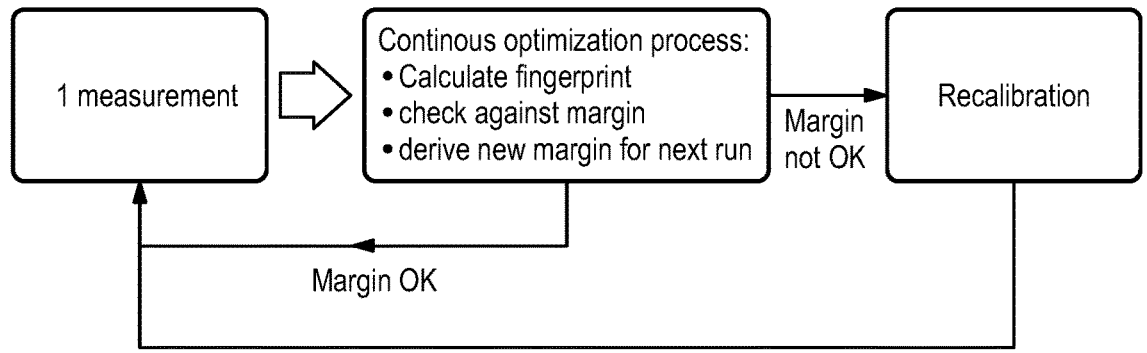
FIG. 2 schematically shows an overview of a calibration routine according to an embodiment of the present disclosure.

In FIG. 2, a respective calibration routine is shown, which illustrates how the calibration of the measurement instrument 12 is managed, for example how the calibration fingerprint is created.

As shown in FIG. 2, parameters are collected from the measurement instrument 12 by the monitoring device 16 for each individual measurement of the device under test 14 by the measurement instrument 12. This is indicated in the first block of FIG. 2 by "1 measurement".

Based on the parameters collected, the calibration fingerprint is calculated by the monitoring device 16, for example the processing circuit 20.

Then, the calibration fingerprint calculated is checked against a margin associated with the calibration fingerprint in order to verify whether the actual calibration fingerprint, which is indicative of the calibration status of the measurement instrument 12, is within the margin or not.

In case that the calibration fingerprint calculated is within the margin provided, no (re-)calibration is necessary and, thus, the next measurement can be performed.

In case that the actual calibration fingerprint is not within the margin, a (re-)calibration of the measurement instrument 12 is necessary (soon). This respective information is outputted via the interface 18 accordingly.

Generally, the respective check is also performed by the monitoring device 14, for example the processing circuit 20.

Further, FIG. 2 shows that a new margin is derived when the check is performed, which is to be applied for the next check, namely the check associated with the next measurement performed by the measurement instrument 12. Hence, the margin used for evaluating the calibration fingerprint is always adapted with respect to the real conditions.

Accordingly, a continuous optimization process is obtained, as the margin is continuously adapted to the real conditions. In other words, the calibration fingerprint is created for each individual measurement performed by the measurement instrument 12.

In a similar manner, the margin used during the internal check of the calibration fingerprint created is also adjusted continuously, namely after each individual check performed.

Thus, the entire system 10 provides a continuous calibration monitoring as well as calibration adaption, as the monitoring device 16 adapts the margin after each check.

Figure 3:
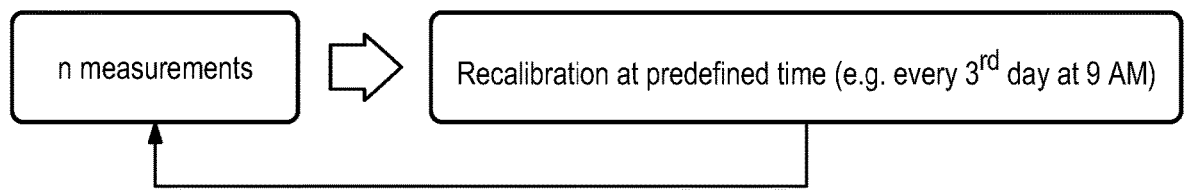
FIG. 3 shows a calibration routine according to the state of the art.

In contrast thereto and shown in FIG. 3, the calibration routine was done in the prior art in a fixed manner, as the (re-)calibration takes place at a predefined time, e.g., every $3^{rd}$ day at 9 AM, after a certain number of measurements has been performed irrespective of the current status of the measurement instrument 12 or rather the measurement setup 17.

As mentioned above, the system 10 for calibration management as well as the respective method of managing calibration of the measurement instrument 16 continuously monitor the calibration fingerprint that is indicative of the calibration status of the measurement instrument 12, wherein the calibration fingerprint is created for each individual measurement performed by the measurement instrument 12.

In order to determine whether the calibration of the measurement instrument 12 is necessary, the monitoring device 16 checks the individually created calibration fingerprint against a margin, which is also adapted dynamically after each check performed. Therefore, the margin used for evaluating the calibration fingerprint is adjusted to the real conditions. The adjustment may be based on deviation(s) determined during the actual check.

When checking the calibration fingerprint created against the margin, an urgency of the calibration can be determined. Hence, the monitoring device 16 may determine if the calibration is not necessary, if the calibration is necessary soon or if the calibration has to be done immediately.

Generally, the system 10 provides a continuous calibration monitoring, as the calibration fingerprint is continuously created for each measurement and checked against the respective margin for each measurement.

Besides the information concerning the calibration, test-specific information may also be generated and outputted via the interface 18.

The test-specific information may relate to a DUT-test specific information that can be used to create a DUT-specific performance sheet. The DUT-specific performance sheet may include a confidence level for the performance metrics and actual score. Hence, it allows to select certain DUTs for a customer who has a specification that the normal device does not meet.

Accordingly, the test-specific information is based on the device under test 14 to be tested by the measurement instrument 12.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A system for calibration management, the system comprising:
    at least one measurement instrument for testing a device under test and a monitoring device, wherein the monitoring device is connected with the measurement instrument,
    wherein the monitoring device collects parameters from the measurement instrument during the testing of the device under test, wherein the testing of the device under test includes the measurement instrument providing a current or voltage to the device under test, wherein the monitoring device monitors the voltage or current provided by the measurement instrument to the device under test and verifies if the measurement instrument is enabled to provide the respective current or voltage constantly, and wherein the monitoring device creates a calibration fingerprint based on the parameters collected, which is indicative of an actual calibration status of the measurement instrument, wherein a dynamic and continuous calibration monitoring is provided by the monitoring device as the calibration fingerprint is calculated by the monitoring device based on the parameters collected during the testing of the device under test by the measurement instrument, wherein the calibration fingerprint provides information concerning the actual calibration status of the measurement instrument, wherein the monitoring device is capable of comparing the calibration fingerprint calculated with a margin associated with the calibration fingerprint, wherein the monitoring device is capable of verifying whether the calibration fingerprint calculated is within the margin or not, and wherein the system comprises an interface via which information based on the calibration fingerprint is outputted, indicating if a new calibration of the measurement instrument is necessary or not, wherein the calibration associated with the calibration fingerprint is different than a service check that has to be done on a regular basis during service intervals due to degradations or variations of internal components of the measurement instrument, as a calibration interval is dynamically adapted provided that the actual calibration status still fulfills respective requirements for proper operability of the measurement instrument within the measurement setup, and wherein the calibration to be performed, which is associated with the calibration fingerprint, concerns the measurement instrument with regard to the measurement setup as the parameters are collected during the testing of the device under test, based on which the calibration fingerprint is determined.

2. The system according to claim 1, wherein the system is a calibration management system that is configured to manage the calibration of the measurement instrument.

3. The system according to claim 1, wherein at least one environmental parameter is also taken into account when creating the calibration fingerprint, and wherein the at least one environmental parameter includes at least one of an environmental temperature and an environmental humidity.

4. The system according to claim 1, wherein the parameters collected include at least one of an uncertainty from a measurement, a check of a golden standard, a parameter defined in IEEE 370, a parameter associated with a movement of a component connected to the measurement instrument, a parameter associated with a movement of the measurement instrument, a power on and power off cycle, an idle time, a usage time, an expected lifetime, a number of failed self-alignments, or a temperature profile of the measurement instrument.

5. The system according to claim 1, wherein at least one of trends or statistics of the parameters are taken into account when creating the calibration fingerprint.

6. The system according to claim 1, wherein the calibration fingerprint is created based on various different methods used for obtaining the parameters.

7. The system according to claim 1, wherein the monitoring device is configured to determine an urgency of the calibration when comparing the calibration fingerprint created with the margin.

8. The system according to claim 1, wherein the monitoring device is configured to identify when comparing the calibration fingerprint created with the margin if the calibration is not necessary, if the calibration is necessary soon or if the calibration has to be done immediately.

9. The system according to claim 1, wherein the monitoring device creates the calibration fingerprint for each measurement performed by the measurement instrument.

10. The system according to claim 1, wherein the monitoring device compares the calibration fingerprint created with the margin for each measurement performed by the measurement instrument.

11. The system according to claim 1, wherein the monitoring device adapts the margin associated with the calibration fingerprint.

12. The system according to claim 11, wherein the monitoring device adapts the margin associated with the calibration fingerprint after each comparison.

13. The system according to claim 1, wherein the information provided via the interface comprises information about how to protract the new calibration.

14. The system according to claim 1, wherein the interface provides test-specific information.

15. The system according to claim 14, wherein the test-specific information is based on the device under test to be tested by the measurement instrument.

16. The system according to claim 1, wherein the monitoring device provides the interface.

17. A method of managing and scheduling calibration of a measurement instrument, the method comprising:
performing a test on a device under test by a measurement instrument of a system for calibration management;
collecting parameters from the measurement instrument during testing of the device under test by a monitoring device of the system for calibration management;
processing the parameters collected by the monitoring device;
creating a calibration fingerprint based on the parameters collected, which is indicative of the calibration status of the measurement instrument, wherein the calibration fingerprint is calculated by the monitoring device based on the parameters collected, such that a dynamic and continuous calibration monitoring is provided by the monitoring device;
comparing the calibration fingerprint calculated with a margin associated with the calibration fingerprint by the monitoring device, wherein the monitoring device adapts the margin associated with the calibration fingerprint;
verifying whether the calibration fingerprint calculated is within the margin or not by the monitoring device; and
outputting information based on the calibration fingerprint via an interface, wherein the information indicates if a new calibration of the measurement instrument is necessary or not, wherein the calibration associated with the calibration fingerprint is different than a service check that has to be done on a regular basis during service intervals due to degradations or variations of internal components of the measurement instrument, as a calibration interval is dynamically adapted provided that the actual calibration status still fulfills respective requirements for proper operability of the measurement instrument within the measurement setup;

wherein the calibration to be performed, which is associated with the calibration fingerprint, concerns the measurement instrument with regard to the measurement setup since the parameters are collected during the testing of the device under test, based on which the calibration fingerprint is determined;

wherein the parameters collected include an uncertainty from a measurement of the device under test, a check of a golden standard used instead of the device under test, scattering parameters integrity measured during the testing of the device under test, a parameter associated with a movement of a component connected to the measurement instrument, a parameter associated with a movement of the measurement instrument itself, a power on and power off cycle of the measurement instrument, an idle time of the measurement instrument, a usage time of the measurement instrument, an expected lifetime of the measurement instrument, a number of failed self-alignments of the measurement instrument, or a temperature profile of the measurement instrument, and wherein the parameters collected are evaluated in order to obtain the calibration fingerprint that provides information concerning the actual calibration status of the measurement instrument, thereby ensuring that effects having an influence on the calibration status are taken into consideration so as to ensure that a ratio of a measurement instrument usage with respect to a down time of the measurement instrument is improved as the calibration interval is dynamically adapted provided that the current calibration status still fulfills respective requirements for proper operability of the measurement instrument within the measurement setup.

18. The system according to claim 1, wherein the calibration fingerprint corresponds to a calculated calibration profile.

19. A system for calibration management, the system comprising:

at least one measurement instrument for testing a device under test and a monitoring device, wherein the monitoring device is connected with the measurement instrument, wherein the monitoring device collects parameters from the measurement instrument during the testing of the device under test, wherein the parameters collected are obtained from a calibration confidence check and/or an integrity check, wherein the monitoring device additionally collects at least one environmental parameter, wherein the at least one environmental parameter includes an environmental temperature and/or an environmental humidity, and wherein the monitoring device creates a calibration fingerprint based on the parameters collected, which is indicative of an actual calibration status of the measurement instrument, wherein a dynamic and continuous calibration monitoring is provided by the monitoring device since the calibration fingerprint is calculated by the monitoring device based on the parameters collected during the testing of the device under test by means of the measurement instrument, wherein the calibration fingerprint provides information concerning the actual calibration status of the measurement instrument, wherein the monitoring device is capable of comparing the calibration fingerprint calculated with a margin associated with the calibration fingerprint, wherein the monitoring device is capable of verifying whether the calibration fingerprint calculated is within the margin or not, and wherein the system comprises an interface via which information based on the calibration fingerprint is outputted, indicating if a new calibration of the measurement instrument is necessary or not, wherein a calibration interval is dynamically adapted provided that the actual calibration status still fulfills respective requirements for proper operability of the measurement instrument within the measurement setup, wherein the monitoring device is configured to determine an urgency of the calibration when comparing the calibration fingerprint created with the margin; and wherein the monitoring device is enabled to provide the respective information concerning the urgency of the calibration via the interface.

* * * * *